United States Patent [19]
Gardner et al.

[11] Patent Number: 5,981,368
[45] Date of Patent: Nov. 9, 1999

[54] ENHANCED SHALLOW JUNCTION DESIGN BY POLYSILICON LINE WIDTH REDUCTION USING OXIDATION WITH INTEGRATED SPACER FORMATION

[75] Inventors: Mark I. Gardner, Cedar Creek; H. Jim Fulford, Jr.; Charles E. May, both of Austin, all of Tex.

[73] Assignee: Advanced Micro Devices, Sunnyvale, Calif.

[21] Appl. No.: 09/187,027

[22] Filed: Nov. 5, 1998

[51] Int. Cl.⁶ .......................... H01L 21/336; H01L 21/28
[52] U.S. Cl. ........................... 438/595; 438/303; 438/290
[58] Field of Search .................... 438/289, 290, 438/291, 303, 453, 439, 585, 595, 655, 656, 756, 787, FOR 204, FOR 346, FOR 352, FOR 353, FOR 356, FOR 360, FOR 398, FOR 399

[56] References Cited

U.S. PATENT DOCUMENTS

| | | | |
|---|---|---|---|
| 3,943,542 | 3/1976 | Ho et al. | 438/585 |
| 4,026,740 | 5/1977 | Owen, III | 438/585 |
| 4,239,559 | 12/1980 | Ito | 438/595 |
| 4,415,383 | 11/1983 | Naem et al. | 438/585 |
| 5,130,264 | 7/1992 | Troxell et al. | |
| 5,776,821 | 7/1998 | Haskell et al. | 438/595 |

*Primary Examiner*—Mary Wilczewski
*Attorney, Agent, or Firm*—Bruce Garlick

[57] ABSTRACT

A method of forming a transistor includes forming a gate dielectric layer upon a substrate, forming a polysilicon layer upon the gate dielectric layer and then forming a thin nitride layer upon the gate polysilicon layer. The thin nitride layer is then pattern etched to define a nitride cap above a future channel. The gate polysilicon layer and a portion of the silicon substrate below the gate dielectric layer is then doped with arsenic. An optional annealing step then causes some of the arsenic to migrate below the nitride cap. A subsequent oxidation step then causes gate conductor/gate oxide stacks with integrated spacers to be defined below the nitride cap. The oxidation step and optional prior annealing step also cause some arsenic to migrate into the channel to form the LDD regions. The substrate is etched to remove portions of the gate polysilicon layer unprotected by the nitride cap. The remaining gate structures below the nitride cap include spacers and LDD regions are formed about the polysilicon gate conductor with the combined structure having a width of the nitride cap. Accordingly, the channel width has been decreased to a size that is even smaller than the width of the nitride cap.

21 Claims, 5 Drawing Sheets

5,981,368

ENHANCED SHALLOW JUNCTION DESIGN BY POLYSILICON LINE WIDTH REDUCTION USING OXIDATION WITH INTEGRATED SPACER FORMATION

BACKGROUND

1. Field of the Invention

The present invention relates generally to integrated circuit manufacture; and more particularly to a method of manufacture and a structure in which enhanced shallow junctions and reduced length channels are formed by polysilicon line width reduction below current photolithographic limits using oxidation with integrated spacer formation.

2. Description of the Related Art

The structure and the various components, or features, of a metal oxide semiconductor (MOS) devices are generally well known. A MOS transistor typically includes a substrate material onto which a gate dielectric and a patterned gate conductor are formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which, a portion of the substrate known as a "well" exists. The well is doped opposite the substrate so that it can accommodate junctions of an impurity type opposite the junction in the non-well areas. Accordingly, wells are often employed when both n-type and p-type transistors (i.e., Complementary MOS, ("CMOS") are needed.

A pervasive trend in modern integrated circuit manufacture is to produce transistors having feature sizes as small as possible. To achieve a high density integrated circuit, features such as the gate conductors, source/drain junctions, and interconnects to the junctions must be made as small as possible. Many modern day processes employ features which have less than 0.15 microns critical dimensions. As feature sizes decrease, the size of the resulting transistors as well as the interconnects between transistors also decrease. Smaller transistor size allows more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow for higher speed integrated circuits to be constructed that have greater processing capabilities and that produce lesser heat.

The benefits of high density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive sub-threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor. In view of these considerations, certain scaling limits are being realized. Unfortunately, however, there continues to exist a need to further reduce device scaling. Thus, there exists a need in the art for better methods of forming devices that have shorter channels.

SUMMARY OF THE INVENTION

The problems outlined above are in large part solved by the transistor formation process according to the present invention in which new approaches are utilized to further reduce transistor channel length in order to achieve new levels of scaling while considering the problems listed above. It has been observed that scaling limitations are introduced or defined by known photolithographic steps. More specifically, photolithography is used to create a gate polysilicon/gate oxide structure to a certain minimum width based upon the photolithography limits. Because this gate polysilicon/gate oxide structure (minimum width) dictates the length of the channel, and because narrower channels are required for scaling purposes, the known photolithographic step limits the amount of scaling that can be achieved in a channel that is formed below the gate polysilicon/gate oxide structure.

Thus, according to the present invention, a thin nitride layer is formed upon the gate polysilicon layer as narrow as possible (limited by photolithography limits) to define the width of a gate conductor/gate oxide stack. Thereafter, the gate polysilicon layer is doped with arsenic. An optional annealing step then causes some of the arsenic to migrate below the nitride cap.

A subsequent oxidation step then causes the gate conductor/gate oxide stack defined by the nitride cap to be made thinner when oxidation of some of the polysilicon under the nitride cap occurs. The combination of the arsenic doping and the annealing operate to control the horizontal oxidation that occurs under the nitride cap. Thus, when the substrate is etched to remove portions of the gate polysilicon layer unprotected by the nitride cap and structures below the nitride cap remain, spacers are formed about the polysilicon gate conductor with the combined structure having a width of the nitride cap.

The oxidation step and optional prior annealing step also cause some arsenic to migrate into the channel to form the LDD regions. Accordingly, the channel width has been decreased to a size that is even smaller than the width of the nitride cap (which was limited by known photolithographic step).

These and other aspects of the present invention will become apparent with further reference to the drawings and specification which follow.

BRIEF DESCRIPTION OF THE DRAWINGS

A better understanding of the present invention can be obtained when the following detailed description of the described embodiments is considered in conjunction with the following drawings, in which.

DETAILED DESCRIPTION OF THE DRAWINGS

Figure 1A:
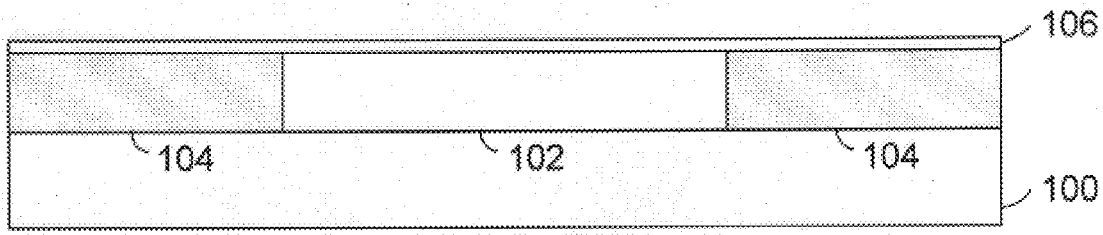
FIGS. 1A through 1D are partial cross-sectional views of a semiconductor substrate illustrating the formation of transistors according to the present invention.

FIGS. 1A through 1D are partial cross-sectional views of a semiconductor substrate illustrating the formation of transistors according to the present invention. Referring now to FIG. 1A, a substrate 100 includes an active region 102 and a plurality of isolation regions 104. In general, FIG. 1A represents a substrate after a first set of steps of integrated the circuit fabrication process as described herein are performed. The active region 102 is a semiconductive region in which an active device may be formed and is one of a great number of active regions that are formed to create an integrated circuit. The isolation regions 104 are formed of an insulating material that serves to isolate active devices or conductive components from other active devices or conductive components. For silicon-based semiconductor circuits, the isolation regions 104 are typically formed of silicon dioxide.

As is known by those skilled in the art, silicon dioxide has many uses in integrated circuits. It is used as insulation between polysilicon and metal layers, between metal layers in multilevel metal systems, as a getter, as a diffusion source, as a diffusion/implant mask, as a capping layer to prevent out diffusion and as a final passivation layer. As is shown herein FIG. 1A, silicon dioxide is used to form the isolation regions 104. The isolation regions 104 may be formed using the well known LOCOS growth process, trenching and filling steps or another isolation process. In general, the invention herein includes all forms of creating isolation regions. In at least one embodiment of the invention, the active region 102 is shielded by a mask and remains protected during formation of isolation regions 104. In the described embodiment, active region 102 is doped P-type. As is understood by those skilled in the art, the p-type active region 102 may result from substrate doping type. Alternatively, if a p-type active region is desired in an n-type wafer, a p-type well will be formed in the wafer.

After the formation of the active and isolation regions 102 and 104, respectively, a gate dielectric layer 106 is grown or deposited on top of active and isolation regions 102 and 104. In the described embodiment, the gate dielectric layer 106 is formed of silicon dioxide and is twenty to thirty Angstroms thick. However, in other embodiments, the gate dielectric 106 could be formed of other materials as well.

Figure 1B:
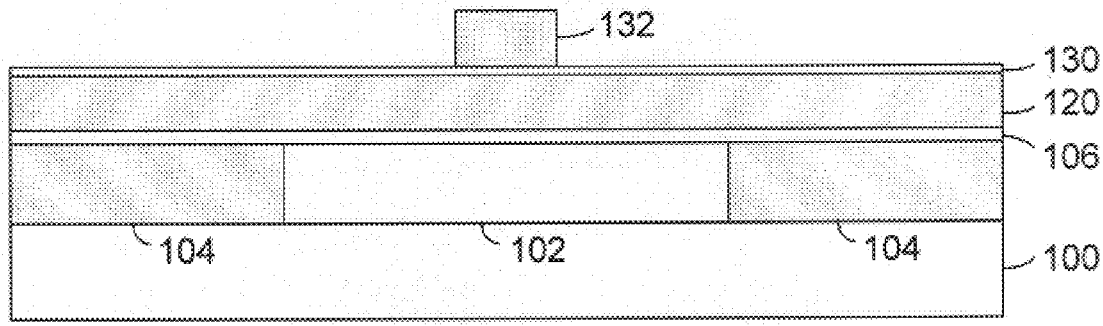

Referring now to FIG. 1B, a polysilicon layer 120 is deposited on top of and across the gate dielectric layer 106. The polysilicon layer 120 may be deposited in a Low Pressure Chemical Vapor Deposition (LPCVD) step or another step that is known in the art. In the described embodiment, polysilicon layer 120 is formed to have a depth or thickness of 500 to 1500 Angstroms.

As may be seen, a nitride layer 130 is formed upon the polysilicon layer 120. The nitride layer 130 is formed using a known technique that may include chemical vapor deposition step. After the nitride layer 130 has been formed, a patterned mask 132 is formed on top of nitride layer 130 to define gate conductor/gate dielectric regions. In one embodiment, the patterned mask 132 is formed by depositing a photoresist across the exposed surface of the nitride layer 130 and exposing the photoresist using a photolithography step. Then, the exposed portions of the photoresist are stripped in an ashing process. Of course, the patterned mask 132 may be formed using other techniques as well.

Figure 1C:
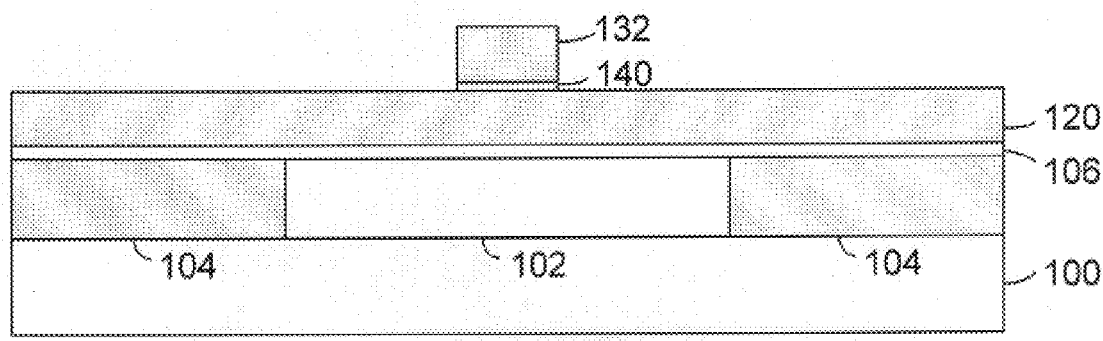

Referring now to FIG. 1C, it may be seen that portions of nitride layer 130 not protected by patterned mask 132 have been removed in an etch step leaving a small portion of nitride layer 130 which shall be referenced herein as a nitride cap 140. The etch technique, however, is selective to the nitride layer 130 so as to not remove the polysilicon layer 120.

Figure 1D:
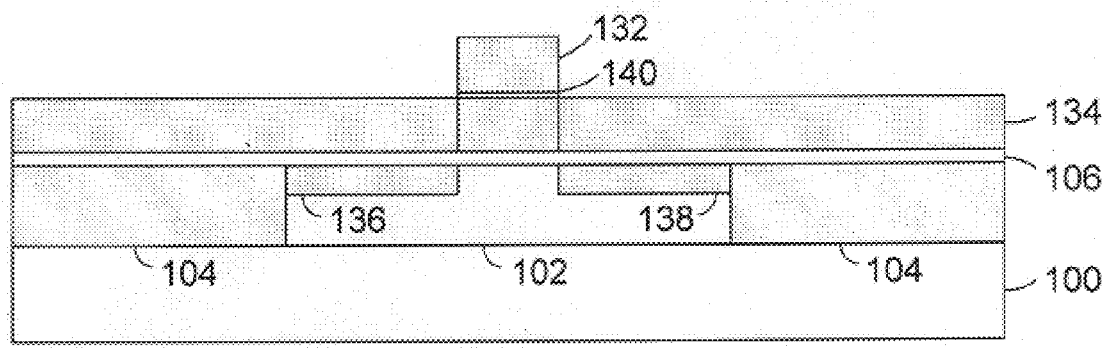

Referring now to FIG. 1D, it may be seen that a dopant has been implanted into substrate 100 so as to dope the polysilicon layer 120 to form a doped polysilicon layer 134 and to form shallow source and drain regions 136 and 138, respectively. Additionally, as may be seen, the implantation of the dopant is performed at an energy level to only partially penetrate active region 102. Resultantly, the source and drain regions 136 and 138 are shallow and do not extend to the full depth of the active region 102 or to the depth of the isolation regions 104. Moreover, as may be seen, the channel formed as a result of the formed source and drain regions extends, in FIG. 1D, to be the length of nitride cap 140. In the embodiment of the invention, the dopant is arsenic.

Figure 2A:
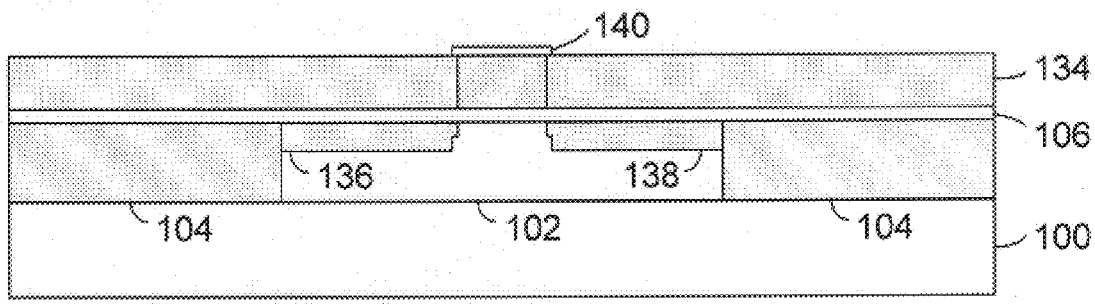
FIGS. 2A through 2D are partial cross sectional views of the semiconductor substrate of FIGS. 1A through 1C illustrating the formation of transistors according to the present invention during subsequent formation steps.

FIGS. 2A through 2D are partial cross sectional views of the semiconductor substrate of FIGS. 1A through 1C illustrating the formation of transistors according to present invention during subsequent formation steps. Referring now to FIG. 2A, it may be seen that after an optional anneal step, some of the arsenic doping in the doped polysilicon layer 134 has migrated into an area below the nitride cap 140. Resultantly, some of polysilicon layer 134 residing below the nitride cap 140 has received some migrated arsenic ions and has become partially doped.

Additionally, some of the dopant in source region 136 and drain region 138 has migrated into portions of active region 102 below the nitride cap 140. The effect is that the arsenic migration into these areas have at least partially formed LDD regions. Resultantly, the channel, as was previously defined by the photolithographic limits of the nitride cap 140 during the prior doping step, is now narrower than the nitride cap 140 (because the LDD regions extend to an area below the nitride cap 140.

Figure 2B:
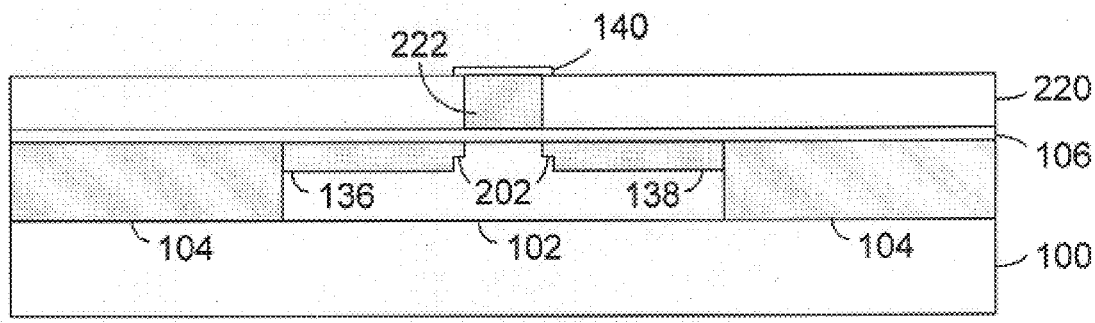

Referring now to FIG. 2B, it may be seen that portions of the polysilicon layer 134 that were not protected by the nitride cap 140 have been oxidized to form an oxidized polysilicon layer 220. Advantageously, some oxidation also occurs under nitride cap 140. Further, portions of the polysilicon layer 134 protected by the nitride cap 140 have remained unchanged to form a polysilicon gate conductor 222. Additionally, the oxidation step also causes arsenic in source region 136 and drain region 138 to migrate into the channel portion of the active region 102 below the nitride cap, further narrowing the channel to a length that is less than that of the nitride cap 140. Resultantly, LDD regions 202 are more fully formed in the channel between source 136 and drain 138.

Figure 2C:
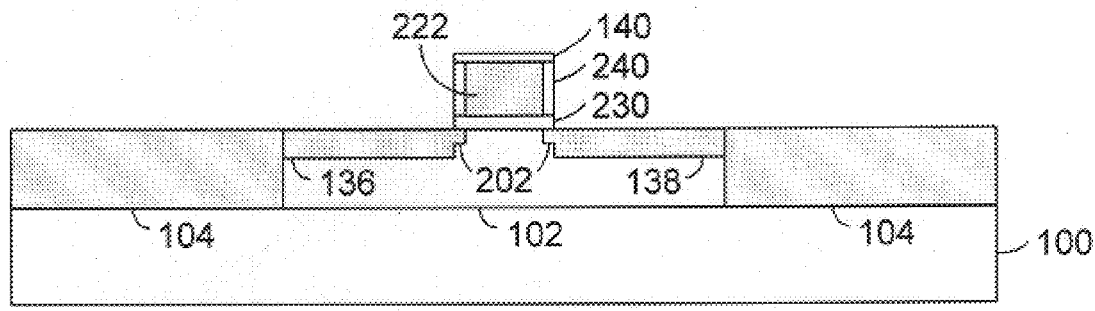

Referring now to FIG. 2C, substrate 100 is shown after an anisotropic etch has been performed to remove portions of oxidized polysilicon layer 220 unprotected by the nitride cap 140. The anisotropic etch, by its vertical nature, creates spacers 240 below the nitride cap 140. One result of the above described processing, as may be seen in FIG. 2C, is that the combination of the polysilicon gate conductor 222 and spacers 240 has a width that is equal to the width of the nitride cap 140.

Figure 2D:
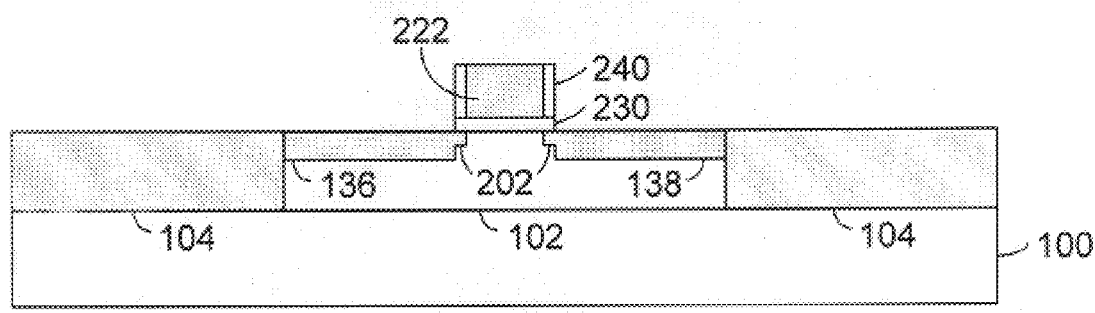

Referring now to FIG. 2D, the substrate 100 is shown after a step has been performed to remove the nitride cap 140. Thus, FIG. 2D shows a completed transistor having a channel length that is less than the lower dimensional limits achievable by the photolithography equipment employed to create the transistor (the lower limit defining the nitride cap 140) Additional components of the transistor, including Vt implants and wells, will be described with reference to FIG. 5.

Figure 3:
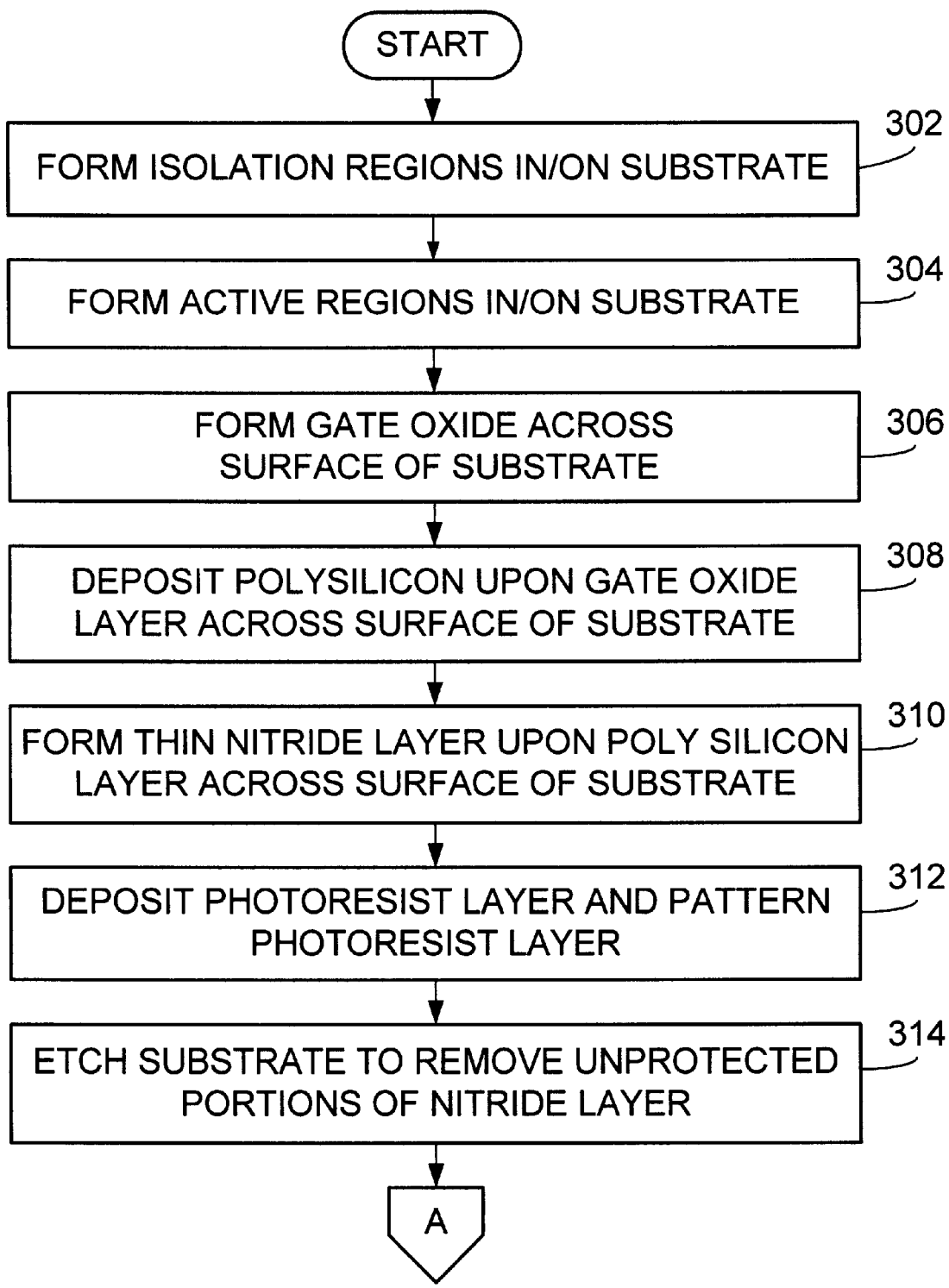
FIG. 3 is a flow chart illustrating a first series of steps of a method for forming a transistor upon a semiconductor substrate according to the present invention.

FIG. 3 is a flow chart illustrating a first series of steps of a method for forming a transistor upon a semiconductor substrate according to the present invention. Referring now to FIG. 3, isolation regions 104 and active regions 102 are formed in/on the substrate 100 of FIGS. 1A–1D (step 302). For the purposes of FIGS. 3 and 4, a process for forming an NMOS device in a p-type substrate is described. After the active regions 102 and isolation regions 104 are formed in steps 302 and 304, respectively, a gate dielectric layer 106 is grown or deposited across the surface of substrate 100 to a thickness of 20 to 30 Angstroms (step 306). Thereafter, a polysilicon layer 120 is deposited to depth of 500 to 1500 Angstroms across surface of substrate (step 308). In the embodiment of the invention, the polysilicon layer 120 is deposited in a Low Pressure Chemical Vapor Deposition (LPCVD) step. It may also be deposited in other steps known in art.

After the deposition of the polysilicon layer 120, a thin nitride layer 130 is formed upon the polysilicon layer 120 (step 310). In the embodiment, the nitride layer 130 is deposited in a chemical vapor deposition process. Once the nitride layer 130 has been deposited, a photoresist layer is deposited and patterned (step 312) using known techniques to form a patterned mask. This known technique may include first spin coating the wafer with a photoresist layer. Thereafter, the photoresist layer is selectively exposed. More specifically, specified portions of the photoresist layer are exposed to one of several forms of radiation including ultraviolet light, electron radiation or x-ray radiation. Thereafter, the unexposed portions of the photoresist layer are removed in a known "development step" to create a patterned mask 132.

After the patterned mask 132 has been formed upon substrate 100, the unprotected portions of the nitride layer 130 are etched to form a nitride cap 140 and to expose portions of the polysilicon layer 120 (step 314). The etching is performed to be selective to nitride so that polysilicon layer 120 remains unetched. At this point in the processing, the patterned mask 132 is allowed to remain. As an optional step, polysilicon layer 120 may be etched slightly at this stage to better receive an implanted dopant in a subsequent step. This optional step is performed in one embodiment of the inventive method described herein.

Figure 4:
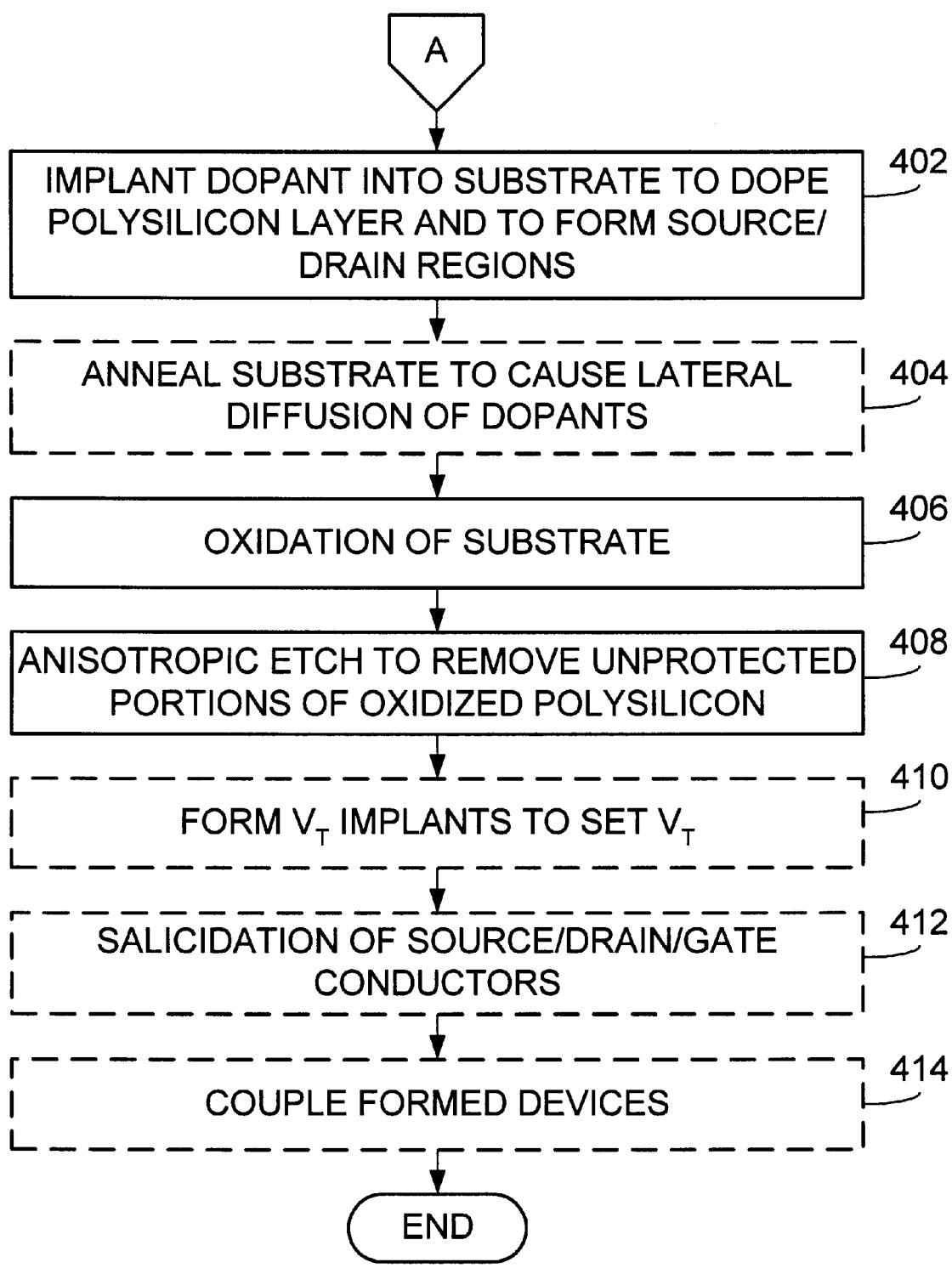
FIG. 4 is a flow chart illustrating a second series of steps of a method for forming a transistor upon a semiconductor substrate according to the present invention.

FIG. 4 is a flow chart illustrating a second series of steps of a method for forming a transistor upon a semiconductor substrate according to the present invention. As may be seen, the steps illustrated in FIG. 4 are a continuation of the method described in FIG. 3. Referring now to FIG. 4, a dopant is implanted into the substrate to dope the polysilicon layer 120 to create a doped polysilicon layer 134 and to form shallow source and drain regions 136 and 138 (step 402). In the embodiment, the ion implant dopant is arsenic. As is understood by those skilled in the art, the patterned mask 132 and nitride cap 140 resist implantation of dopants. The implant step is performed using an arsenic dose of 2 to $8 \times 10^{15}$ ions/cm$^2$ with implant energy of 80 KeV and 300 KeV. An implant energy of 80 KeV corresponds to an implant depth of 500 Angstroms. An implant energy of 300 KeV corresponds to an implant depth of 1500 Angstroms. Thus, the implant energy that is chosen is one that considers the thickness of the polysilicon layer 120 and the desired thickness of the source and drain regions 136 and 138 respectively.

After the ion implant step, an optional anneal step may be performed to cause some of the implant dopant (arsenic) in doped polysilicon layer 134 to migrate to an area below the nitride cap 140 (step 404). As a result of the optional anneal step, some of polysilicon layer 134 residing below the nitride cap 140 receives some migrated arsenic ions and becomes partially doped. Additionally, some of the dopant in source region 136 and drain region 138 migrate to a portion of the active region below nitride cap 140. These areas will begin to form LDD regions, thereby narrowing the channel residing below gate oxide and gate polysilicon conductor.

After the optional annealing step, the substrate is subjected to an oxidation step (step 406). In the oxidation step, unprotected portions of polysilicon layer 134 are oxidized to form an oxidized polysilicon layer 220 and to define the gate conductor 222. The oxidation step is performed in a wet environment with H$_2$ and O$_2$ present. In the embodiment, this oxidation step is performed at 800 to 950 degrees Celsius for a period of 15 minutes to 1 hour.

Oxidation of the doped polysilicon layer 134 occurs more quickly than oxidation of an undoped polysilicon (such as the polysilicon gate conductor 222). Furthermore, the oxidation proceeds at a five to one ratio, wherein five units are oxidized vertically while one unit is oxidized horizontally. Thus, when the doped polysilicon layer 134 is fully oxidized in the vertical direction, some oxidation has occurred horizontally below the nitride cap 140, but at a lesser distance. The horizontal/vertical oxidation ratio and the difference in doping between the doped polysilicon layer 134 and the polysilicon gate conductor 222 both contribute to a controlled oxidation of the polysilicon gate conductor 222 below the nitride cap 140.

The oxidation step also causes the arsenic in source region 136 and drain region 138 to migrate into the active region below the nitride cap 140. Accordingly, this step operates to further narrow the channel under the nitride cap 140. Resultantly, LDD regions 202 are formed by the migration of dopants from the source region 136 into the active region 102 below the gate conductor 222 and the migration of dopants from the drain region 138 into the active region 102 below the gate conductor 222.

After the oxidation step of step 406, an anisotropic etch is performed to portions of the oxidized polysilicon layer 220

(step 408) unprotected by the nitride cap 140. After the anisotropic etch of step 408 has been performed to remove portions of oxidized polysilicon layer 220, one may observe in FIG. 2C that spacers 240 have been formed below nitride cap 140. These spacers result from the horizontal oxidation that occurred in the undoped portions of polysilicon layer 222 as described above. Additionally, because of the arsenic migration from the source and drain regions to form LDD regions 202, the channel that is defined by the area between LDD regions 202 of FIG. 2C is narrower than nitride cap 140 and the also is narrower than the combination of the polysilicon gate conductor 222 and spacers 240.

Continuing to refer to FIG. 4, after nitride cap 140 has been removed (not shown herein FIG. 4), further optional steps may be performed. These steps include forming Vt implants to set the threshold voltage Vt (step 410). Additionally, the salicidation of source/drain/gate conductors may be completed (step 412). At this point, formation of devices for the integrated circuit is complete to a point that the devices may be interconnected (step 414).

The above processes described the formation of an NMOS device in a p-type substrate. To form a PMOS device in an n-type substrate, some of the steps require alteration. For example, instead of implanting arsenic all the way into the source and drain regions, as described in step 402, a lower implant energy is used in step 402 to only implant the dopant into the polysilicon layer 134. Alternatively, the same implant of arsenic into source/drain regions may be performed. If the arsenic is doped into the source and drain regions, however, a counterdoping step must be performed with boron after step 410 in order to overcome the arsenic doping in the source and drain regions. The boron should be doped with a concentration of $8 \times 10^{15}$ to overcome the arsenic doping of step 402. Accordingly, an optional annealing step, if one is desired, must be performed and the boron has been implanted into the source and drain regions to form the p-type LDD regions.

Figure 5:
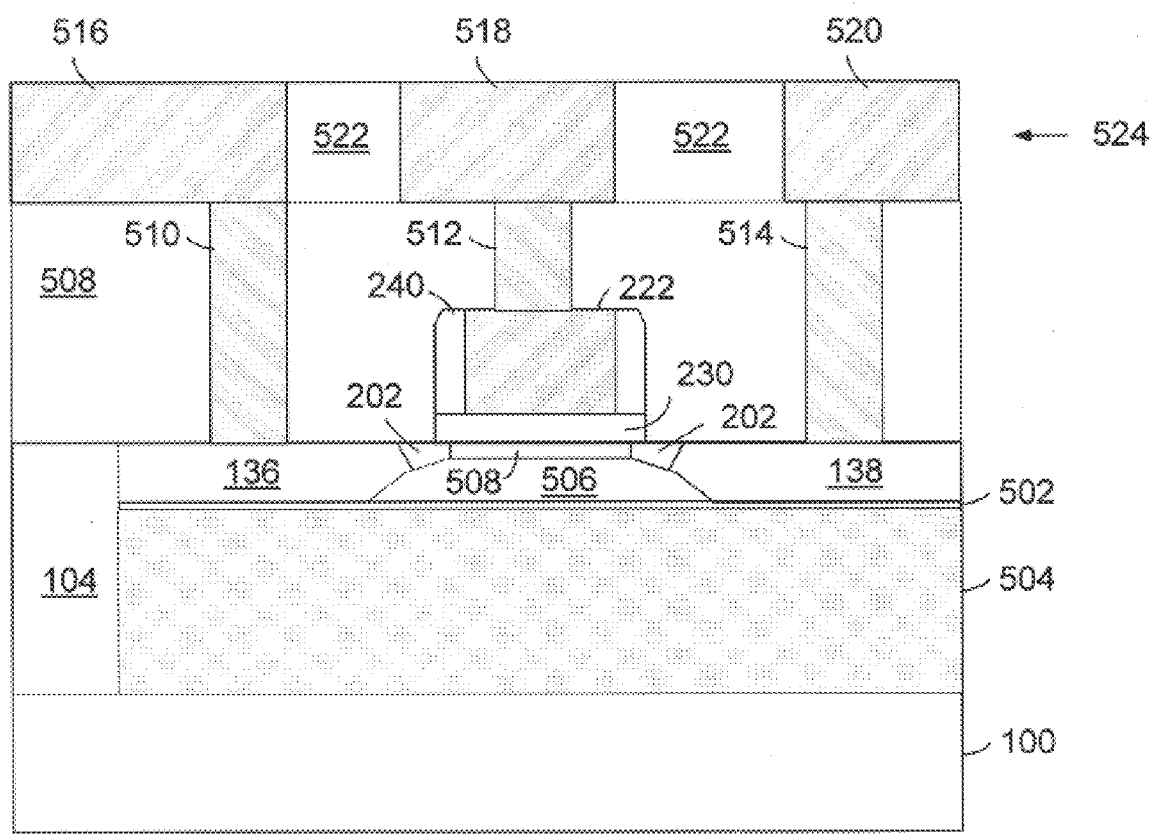
FIG. 5 is a partial cross sectional diagram of a transistor that has been formed according to the present invention that illustrates in detail the components of the transistor and how the transistor can be connected to other transistors to form an integrated circuit.

FIG. 5 is a partial cross sectional diagram of a transistor which has been formed according to the present invention and that illustrates in detail the components of the transistor and how the transistor can be connected to other transistors to form an integrated circuit. Referring now to FIG. 5, each of the components as discussed previously include the part numbers used to introduce the components. For example, FIG. 5 illustrates the LDD regions 202 formed as described in step 404 of FIG. 4 as well as the source 136 and the drain 138 of the transistor after being doped as discussed in relation to step 402 of FIG. 4.

FIG. 5 also illustrates the channel 506 formed between source 136 and drain 138. Punchthrough region 502 and well 504 are shown to be formed in the active region 102. Vt region 508 is shown as formed under the gate dielectric 230. Isolation region 104 resides adjacent the active region.

An insulation layer 508 is formed in a CVD process upon the transistor and other portions of the substrate at a thickness that is required to isolate a first metallization layer 524 of the device of FIG. 5 from transistors and other devices of the integrated circuit. Typically, the insulation layer 508 is polished in a CMP process to form a planar upper surface. It is then masked and etched to form openings to the active regions of the transistors (e.g., source 136, drain 138 and gate conductor 222).

Once the openings are formed, a sputtering, deposition or evaporation process, by way of example, is used to fill the vias with a metal. The resulting metallized vias 510, 512 and 514 are formed. Metals that can be used in this process include Ti, TiN, W and Al. The vias 510, 512 and 514 may be deposited in a same step that forms metallization layer 524. The metallization layer 524 is then masked to form a conductor pattern and is etched back to the insulation layer 508 to form the conductors 516, 518 and 520. An insulator layer 522 may be formed to isolate conductive paths 516, 518 and 520 formed in the metallization layer 524, particularly if a subsequent metallization layer is formed upon the metallization layer 524. Subsequent metallization layers (not shown) can provide further interconnections among the devices and external to the formed integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method for forming a scaled transistor on a substrate, comprising:

forming a gate dielectric layer on the substrate;

forming a polysilicon layer on the oxide layer;

forming a patterned mask on the polysilicon layer to define protected areas and unprotected areas;

oxidizing the polysilicon layer to form oxidized polysilicon below the unprotected areas and to form oxidized polysilicon below portions of the protected areas bordering the unprotected areas;

isotropically etching the polysilicon layer to remove portions of the oxidized polysilicon below the unprotected areas; and removing the patterned mask to reveal gate structures residing above a channel that have a polysilicon gate conductor residing upon a gate dielectric and integrally formed spacers residing adjacent the polysilicon gate conductor.

2. The method of claim 1, wherein:

the patterned mask includes a nitride layer and a photoresist layer formed upon the nitride layer; and the photoresist layer is removed prior to the step of oxidizing portions of the polysilicon layer.

3. The method of claim 1, further comprising doping the polysilicon layer below the unprotected areas prior to the step of oxidizing portions of the polysilicon layer to form a source and a drain.

4. The method of claim 3, wherein the doping includes doping an active region of the substrate to form a source and a drain.

5. The method of claim 4, further comprising annealing the substrate to cause a portion of the dopants to migrate to an active area of the substrate below the protected areas to form lightly doped drain regions.

6. The method of claim 3, further comprising annealing the substrate to cause a portion of the dopants to migrate to a portion of the polysilicon layer below the protected areas.

7. The method of claim 3, wherein a dopant used comprises arsenic.

8. The method of claim 1, wherein in the oxidation step, the oxidation proceeds vertically into the polysilicon layer at approximately five times the rate at which the oxidation proceeds horizontally into the polysilicon layer.

9. The method of claim 1, wherein the gate dielectric comprises an oxide and has a thickness of between 20 and 30 Angstroms.

10. The method of claim 1, wherein the polysilicon layer has a thickness of between 500 and 1500 Angstroms.

11. The method of claim 1, further comprising:

forming isolation regions; and forming active regions.

12. The method of claim 1, further comprising forming wells in the substrate.

13. The method of claim 1, further comprising forming voltage threshold regions in the channel.

14. The method of claim 1, further comprising forming a punchthrough region below the channel.

15. The method of claim 1, further comprising:

forming a plurality of transistors according to the previous steps; and interconnecting the transistors to form an integrated circuit.

16. A method of forming a scaled device upon a substrate having a source region and a drain region, the source and drain regions defining a channel there between having a channel length, the method comprising:

forming a gate dielectric layer upon the substrate;

forming a gate conductor layer upon the substrate;

forming a nitride cap on the gate conductor layer above the channel, the nitride cap having a cap length being as small as lithographic processes allow;

forming a gate conductor and spacers beneath the nitride cap by oxidizing the gate conductor layer; and removing portions of the gate conductor layer and gate dielectric layer unprotected by the nitride cap; and removing the nitride cap.

17. The method of claim 16, further comprising forming lightly doped drain regions in the channel wherein the lightly doped drain regions decrease the channel length to being less than the cap length.

18. The method of claim 17 further comprising annealing the substrate to form the lightly doped drain regions.

19. The method of claim 16, further comprising forming threshold voltage implants to alter a threshold voltage of the device.

20. The method of claim 16, further comprising a salicidation step.

21. The method of claim 16, further comprising forming threshold voltage implants to alter a threshold voltage of the device.

* * * * *

UNITED STATES PATENT AND TRADEMARK OFFICE
CERTIFICATE OF CORRECTION

PATENT NO. : 5,981,368
DATED : November 9, 1999
INVENTOR(S) : Mark I. Gardner, Jim Fulford, Jr. and Charles E. May It is certified that error appears in the above-identified patent and that said Letters Patent is hereby corrected as shown below:

Column 8,
Line 25, replace "oxide layer" with -- gate dielectric layer --.

Signed and Sealed this

Twentieth Day of July, 2004

JON W. DUDAS
*Acting Director of the United States Patent and Trademark Office*